United States Patent
Zandifar et al.

(10) Patent No.: US 8,269,836 B2
(45) Date of Patent: Sep. 18, 2012

(54) IMAGE CAPTURE, ALIGNMENT, AND REGISTRATION

(75) Inventors: Ali Zandifar, Cupertino, CA (US); Kar-Han Tan, Santa Clara, CA (US); Jing Xiao, Cupertino, CA (US)

(73) Assignee: Seiko Epson Corporation, Tokyo (JP)

( * ) Notice: Subject to any disclaimer, the term of this patent is extended or adjusted under 35 U.S.C. 154(b) by 1090 days.

(21) Appl. No.: 12/179,324

(22) Filed: Jul. 24, 2008

(65) Prior Publication Data

US 2010/0020167 A1 Jan. 28, 2010

(51) Int. Cl.
G06K 9/62 (2006.01)
H04N 3/02 (2006.01)
G06K 9/00 (2006.01)

(52) U.S. Cl. .......... 348/195; 348/199; 382/209

(58) Field of Classification Search .......... 382/145, 382/147, 190, 209; 348/195, 199
See application file for complete search history.

(56) References Cited

U.S. PATENT DOCUMENTS

| | | | |
|---|---|---|---|
| 4,185,298 A | 1/1980 | Billet et al. | |
| 4,578,810 A | 3/1986 | MacFarlane et al. | |
| 4,783,826 A * | 11/1988 | Koso ............................. | 382/147 |
| 5,517,235 A | 5/1996 | Wasserman | |
| 6,219,442 B1 | 4/2001 | Harper et al. | |
| 6,330,353 B1 * | 12/2001 | Lai et al. ...................... | 382/147 |
| 6,434,264 B1 | 8/2002 | Asar | |
| 6,477,266 B1 | 11/2002 | Asar | |
| 6,546,528 B1 | 4/2003 | Sasaki et al. | |
| 6,641,983 B1 | 11/2003 | Lee et al. | |
| 6,681,038 B2 | 1/2004 | Vilella | |
| 6,724,473 B2 | 4/2004 | Leong et al. | |
| 6,771,807 B2 * | 8/2004 | Coulombe et al. ............. | 382/149 |
| 6,795,186 B2 | 9/2004 | Aspir et al. | |
| 6,917,699 B2 * | 7/2005 | Sugawara ...................... | 382/151 |
| 6,969,864 B2 | 11/2005 | Ye et al. | |
| 6,970,588 B1 | 11/2005 | Komatsu | |
| 7,027,639 B2 | 4/2006 | Fishbaine | |
| 7,167,583 B1 | 1/2007 | Lipson et al. | |
| 7,295,695 B1 * | 11/2007 | Dayal ........................... | 382/145 |
| 7,655,904 B2 * | 2/2010 | Yamashita ..................... | 250/306 |
| 2003/0080727 A1 | 5/2003 | Yamauchi et al. | |
| 2007/0146695 A1 | 6/2007 | Brouwer et al. | |

\* cited by examiner

*Primary Examiner* — Aaron Strange

(57) ABSTRACT

Embodiments of the present invention enable image capture, alignment, and registration. Certain applications of the present invention are its use in various embodiments of a system for inspection of a printed circuit board ("PCB") substrate. In embodiments, an image capture system comprising a camera and a two-dimensional surface supporting an image may be calibrated based on configuration parameters of an image to be captured and of a simulated reference bitmap based on the image. In embodiments, the position of the image to be captured on the two-dimensional surface is determined based on calibration parameters. In embodiments, a sequence of images may be captured of sections of an image that cannot be captured in a single scan. A scan path across the image may be determined that is based in part on calibration parameters. In embodiments, consistency of quality of captured images is maintained by validating selected characteristics of each image as it is being captured and by validating the alignment of each captured image with a corresponding simulated reference bitmap.

20 Claims, 8 Drawing Sheets reference bitmap
120 input image
140 distortion map
160

IMAGE CAPTURE, ALIGNMENT, AND REGISTRATION

BACKGROUND

A. Technical Field

The present invention pertains generally to image processing, and relates more particularly to systems and methods for image capture, alignment, and registration.

B. Background of the Invention

In printed circuit board (PCB) manufacturing, a PCB pattern image is printed directly onto a PCB substrate. It is important that this PCB image be as accurate as possible, because errors or aberrations in the image may result in errors in the manufactured PCB substrate.

Typically, a PCB pattern is printed as a dot-pattern image by an industrial inkjet printer. It is important to be able to calibrate such printers as well as perform quality control in order to insure that their printing performance is consistent and meets specifications. An inkjet printer head contains a set of nozzles, and the output of a particular nozzle may be correlated to regions of the dot-pattern image being printed. After periods of printer continuous use, a nozzle may become clogged or otherwise malfunction, which could lead to errors or aberrations in the image being printed.

Ceramic PCB substrates with a pattern printed by industrial inkjet printers typically are cured between successive printing cycles by a baking process. The presence of surface contaminants and the act of curing may result in the distortion of printed features. In addition to uniform shrinkage, the printed pattern is also subject to non-uniform shrinkage based on the local geometry of printed material. Distortions in the printed pattern and misfiring ink jet nozzles may also create circuit errors such as open and short circuits (topological distortions), and misalignment of circuit features (geometric distortions) between multiple printing passes.

If a nozzle's "signature" can be characterized in terms of the quality of its rendering of a region of a dot pattern, a malfunctioning printer and the cause of the malfunction could be identified through inspection of the images it produces. It would be useful to be able to identify and correct printing errors resulting from a malfunctioning printer before more costly manufacturing errors are incurred.

SUMMARY OF THE INVENTION

Embodiments of the present invention enable image capture, alignment, and registration. Certain applications of the present invention are its use in various embodiments of a system for inspection of a printed circuit board ("PCB") substrate. In embodiments, an image capture system comprising a camera and a two-dimensional surface supporting an image may be calibrated based on configuration parameters of an image to be captured and of a simulated reference bitmap based on the image. In embodiments, the position of the image to be captured on the two-dimensional surface is determined based on calibration parameters. In embodiments, a sequence of images may be captured of sections of an image that cannot be captured in a single scan. A scan path across the image may be determined that is based in part on calibration parameters. In embodiments, consistency of quality of captured images is maintained by validating selected characteristics of each image as it is being captured and by validating the alignment of each captured image with a corresponding simulated reference bitmap.

In embodiments, a method for capturing a valid snapshot of an image may comprise identifying a set of calibration parameters based at least in part on the image, a first snapshot, a two-dimensional surface on which the image is located, and a reference bitmap corresponding to the first snapshot; identifying a first location of the first snapshot on the two-dimensional surface based at least in part on one calibration parameter within the set of calibration parameters; capturing the first snapshot at the first location on the two-dimensional surface; defining a first alignment relationship between the reference bitmap and the first snapshot; and determining whether the first alignment relationship is valid based on a first alignment value of the first alignment relationship being applied to an alignment threshold value. If the first alignment relationship is not valid, a second alignment relationship of a second snapshot of the image and the reference bitmap is validated by performing the steps comprising capturing the second snapshot at a second location on the two-dimensional surface, the second location being within an adjustment distance threshold of the first location; defining the second alignment relationship between the reference bitmap and the second snapshot; validating the second alignment relationship in response to a second alignment value of the second alignment relationship being less than the alignment threshold value; and designating the second snapshot as the valid snapshot.

In embodiments, the method for capturing a valid snapshot may further comprise registering the valid snapshot by performing the steps comprising associating the valid snapshot with the first location on the two-dimensional surface; adjusting the valid snapshot by aligning the valid snapshot with the reference bitmap; and storing the valid snapshot. In embodiments, the valid snapshot exceeds an image quality threshold.

In embodiments, the first snapshot may be within a sequenced set of snapshots where the first snapshot represents a first section of the image. In embodiments, a third snapshot representing a second section of the image within the sequenced set of snapshots may be captured, if the third snapshot follows the first snapshot within the sequenced set of snapshots. In embodiments, the third snapshot is at a third location on the two-dimensional surface that is within a threshold distance of the first location. The threshold distance may be calculated based at least in part on the first location and at least one calibration parameter within the set of configuration parameters.

In embodiments, the first alignment relationship may comprise a robust alignment mapping between the first snapshot and the reference bitmap. In embodiments, the robust alignment mapping is based at least in part on a set of matching features of the first snapshot and the reference bitmap. In embodiments, the robust alignment mapping is represented as an affine matrix.

In embodiments, determining whether the first alignment relationship is valid may be performed by the steps of calculating an angle of rotation by using the affine matrix; and determining the first alignment relationship is valid in response to the angle of rotation being greater than zero and less than a size threshold value.

In embodiments, a method for calculating an alignment mapping between an image and a reference bitmap corresponding to the image may comprise identifying a set of matching features within the image and the reference bitmap; creating a first feature vector comprising a subset of the set of matching features associated with the image; creating a second feature vector comprising a subset of the set of matching features associated with the reference bitmap; calculating a first mapping between the first feature vector and the second feature vector; calculating a first error value based on the first mapping; and identifying the first mapping as the alignment mapping if the error value is less than an error threshold value.

In embodiments, the first mapping is a first affine matrix. In embodiments, computing the first error valued based on the first mapping may comprise identifying a set of residuals associated with the first affine matrix; calculating a mean of the set of residuals; and designating the mean as the first error value.

In embodiments, if the first error value is greater than the error threshold value, the alignment mapping may be identified by performing the steps comprising calculating a standard deviation of the set of residuals; identifying an upper limit value as a multiple of the standard deviation; identifying a lower limit value as zero minus the upper limit value; identifying at least one matching feature from the second feature vector that has a value greater than the lower limit value and less than the upper limits value; creating a third feature vector containing at least one matching feature from the second feature vector; calculating a second mapping between the first feature vector and the third feature vector; calculating a second error value based on the second mapping; and designating the second mapping as the alignment mapping if the second error value is less than the error threshold value.

In embodiments, a system for capturing and aligning a snapshot of an image may comprise an image capturer that receives a set of calibration parameters and the image and captures the snapshot at a location on a two-dimensional surface; an image validator that receives the snapshot and a reference bitmap corresponding to the snapshot and compares at least one characteristic of the snapshot to an image quality threshold; and an image aligner that receives a snapshot with at least one characteristic that exceeds the image quality threshold and the reference bitmap and aligns the snapshot and the reference bitmap if a valid alignment relationship between the snapshot and the reference bitmap has been determined.

Some features and advantages of the invention have been generally described in this summary section; however, additional features, advantages, and embodiments are presented herein or will be apparent to one of ordinary skill in the art in view of the drawings, specification, and claims hereof. Accordingly, it should be understood that the scope of the invention shall not be limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different systems and devices including camera, scanners, printers, computers, facsimile machine, mobile devices, including those devices with a display or camera capabilities, multimedia devices, and the like. The embodiments of the present invention may be implemented in software, hardware, firmware, or combinations thereof.

Components, or modules, shown in block diagrams are illustrative of exemplary embodiments of the invention and are meant to avoid obscuring the invention. It shall also be understood that throughout this discussion that components may be described as separate functional units, which may comprise sub-units, but those skilled in the art will recognize that the various components, or portions thereof, may be divided into separate components or may be integrated together, including integrating within a single system or component.

Furthermore, connections between components/modules within the figures are not intended to be limited to direct connections. Rather, data between these components may be modified, re-formatted, or otherwise changed by intermediary components. Also, additional or fewer connections may be used. It shall also be noted that the terms "coupled" or "communicatively coupled" shall be understood to include direct connections, indirect connections through one or more intermediary devices, and wireless connections.

Reference in the specification to "one embodiment" or "an embodiment" means that a particular feature, structure, characteristic, or function described in connection with the embodiment is included in at least one embodiment of the invention and may be in more than one embodiment. The appearances of the phrase "in one embodiment" or "in an embodiment" in various places in the specification are not necessarily all referring to the same embodiment.

Certain applications of the present invention are its use in various embodiments of a system for inspection of a printed circuit board ("PCB") substrate. A PCB pattern may be printed onto a substrate as a dot-pattern image by an industrial ink jet printer; the dot pattern is produced by an array of printer ink nozzles. After some period of continuous use of an ink jet printer, some of its nozzles may become clogged or may malfunction, and this may lead to aberrations in the dot-pattern image being printed. An aberration in a printed PCB pattern may correspond to a circuit defect such as a short or a broken connection.

Figure 1:
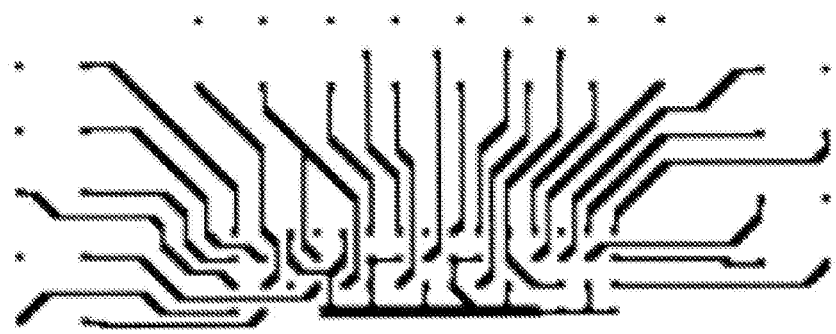
FIG. 1 illustrates examples of a simulated reference bitmap, a reconstructed bitmap image, and a distortion bitmap of a printed PCB pattern according to various embodiments of the invention.
Figure 1:
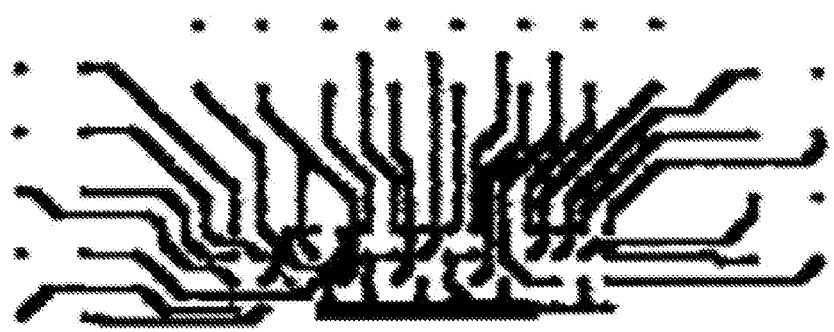
Figure 1:
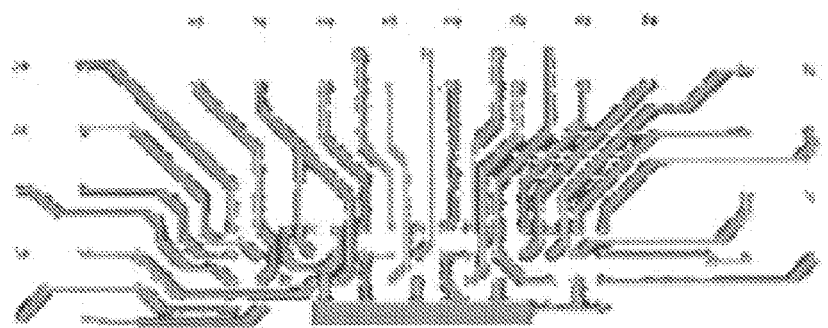

An inspection system is applied to PCB images that have been printed by an ink jet printer. Such an inspection system may enable identification of faults in a printed PCB image and also may enable determination of which nozzles were associated with the locations of the identified faults on the printed image. FIG. 1 illustrates an example of fault detection in a printed PCB image according to various embodiments of the invention. A printed image of a PCB pattern 140 may be compared to a simulated reference bitmap of the PCB pattern 120, and a distortion map 160 that represents differences between the printed image 140 and the reference bitmap 120 may be generated. In embodiments, regions of the distortion map 160 are color-coded to identify aberrations associated with faults in the printed image 140.

Figure 2A:
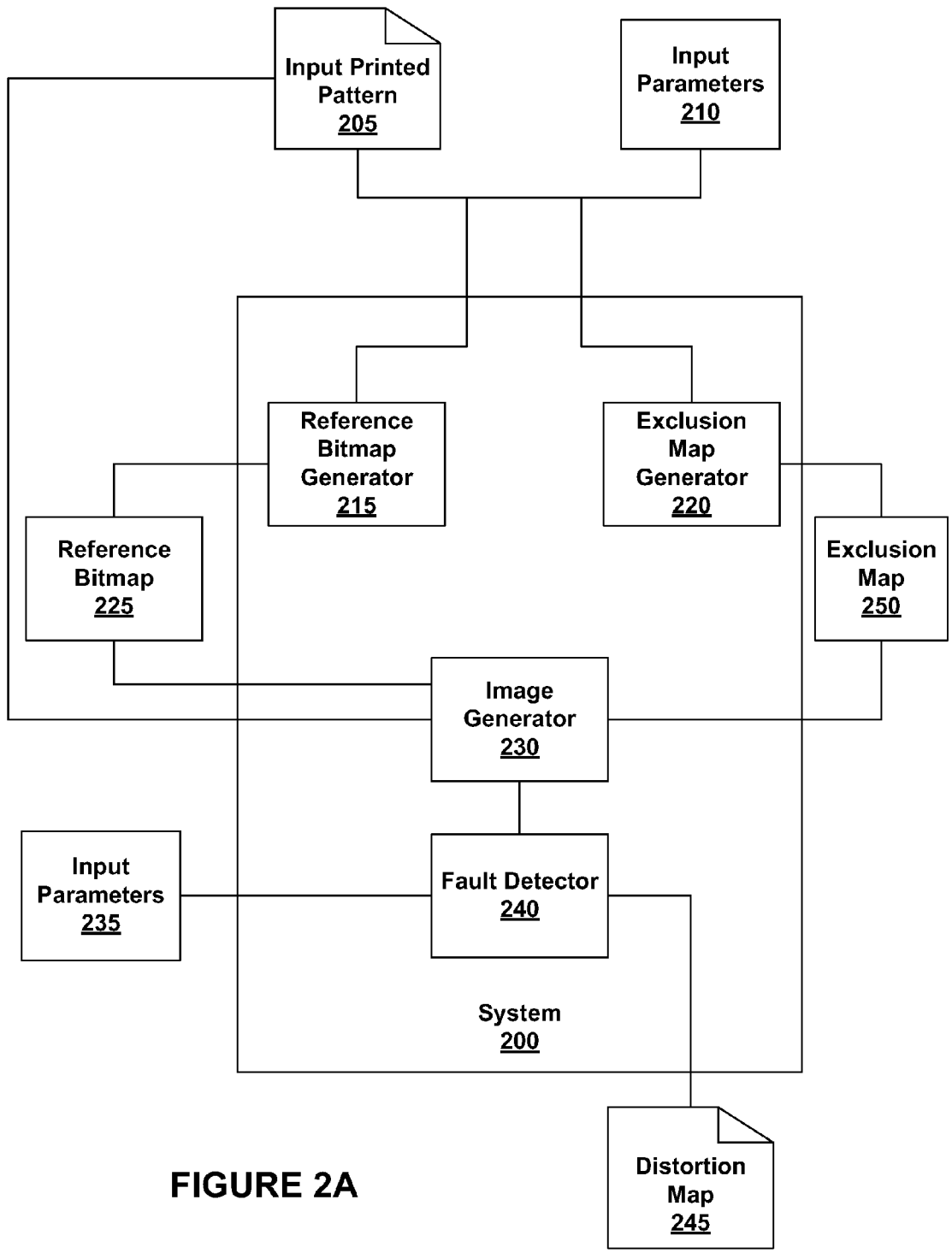
FIG. 2A depicts a block diagram of a system for inspection of a printed PCB bitmap according to various embodiments of the invention.

FIG. 2A depicts a block diagram of a system 200 for inspection of a printed image according to various embodiments of the invention. System 200 receives an input printed pattern 205 (for example, the printed image of a PCB substrate) and compares it to a reference bitmap 225 that is generated based on the input printed pattern 205 by a reference bitmap generator 215. The reference bitmap is a simulation of the printed input printed pattern 205 and is intended to exclude a majority, if not all, of the aberrations that may be caused by, for example, the printing of the dot-pattern bitmap image on a PCB substrate.

In embodiments, a reference bitmap 225 with a specified configuration may be generated from an input printed pattern 205 and user-input parameters 210. The generated reference bitmap 225 may have a different size and configuration from the size and configuration of the input printed pattern 205 on which it is based in order to increase the resolution of the reference bitmap 225. In embodiments, user-input parameters 210 are used to compute configuration parameters for the reference bitmap to be generated. User-input parameters 210 may include printer pitch as dots-per-inch (DPI) in the x and y directions, printer droplet size (an inkjet printer nozzle renders a dot as a "droplet" of ink that has an ideal circular shape), and the DPI of the simulated pattern that will be produced. A scaling factor may be computed that relates configuration parameters of the input printed pattern 205 to configuration parameters of its reference bitmap 225.

The input printed pattern 205 and the reference bitmap 225 are compared by an image generator 230. A fault detector 240, configurable by user-input parameters 235, creates a distortion map 245 of aberrations that may have been discovered during the comparison of the input printed pattern 205 with the generated reference image 225. An exemplary distortion map 160 is illustrated in FIG. 1.

The input printed pattern 205 may be very large. Large images may be divided into sections, and then selected sections may be compared with corresponding sections of the reference bitmap 225. In embodiments, sections to be compared may be selected through user-input parameters 210. An "exclusion map" 250 of the input image that is generated by an exclusion map generator 220 may be used in the selection of sections to compare. An exclusion map identifies areas of non-inspection within an input printed pattern 205 such as areas of the background. In embodiments, an image may be reconstructed based on, in part, a set of sections, the input printed pattern 205, the reference bitmap 225, and the exclusion map 250. The reconstructed image may become the basis for fault detection as previously described. An exemplary reconstructed PCB pattern image 140 is illustrated in FIG. 1.

A. System Implementations

Figure 2B:
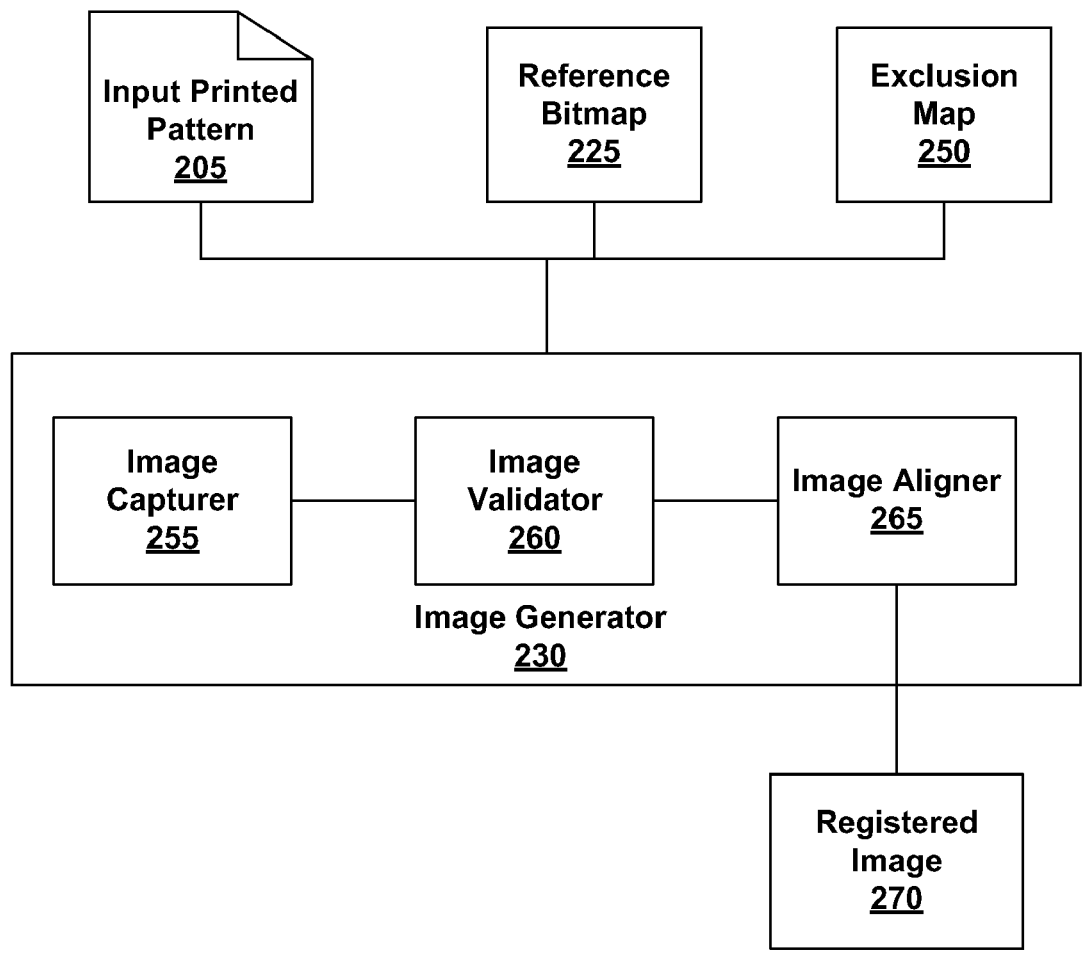
FIG. 2B depicts a block diagram of an image generator system for generating a registered image according to various embodiments of the invention.

FIG. 2B depicts a block diagram of an image generator 230 according to various embodiments of the invention. Image generator 230 receives an input printed pattern 205 and a reference bitmap 225 that has been generated from the input printed pattern 205, and generates a stored valid snapshot (a registered image 265) of the input printed pattern 205. In embodiments, image generator 230 may receive an exclusion map 250. An image generator 230 may be used in embodiments of inspection system 200 to generate a high-resolution image of the input printed pattern 205. In various embodiments, image generator 230 may identify and record the location of an input printed pattern 205 that is a section of a large printed pattern. The large registered image may be reconstructed from a set of sections that have been captured and stored.

Figure 3:
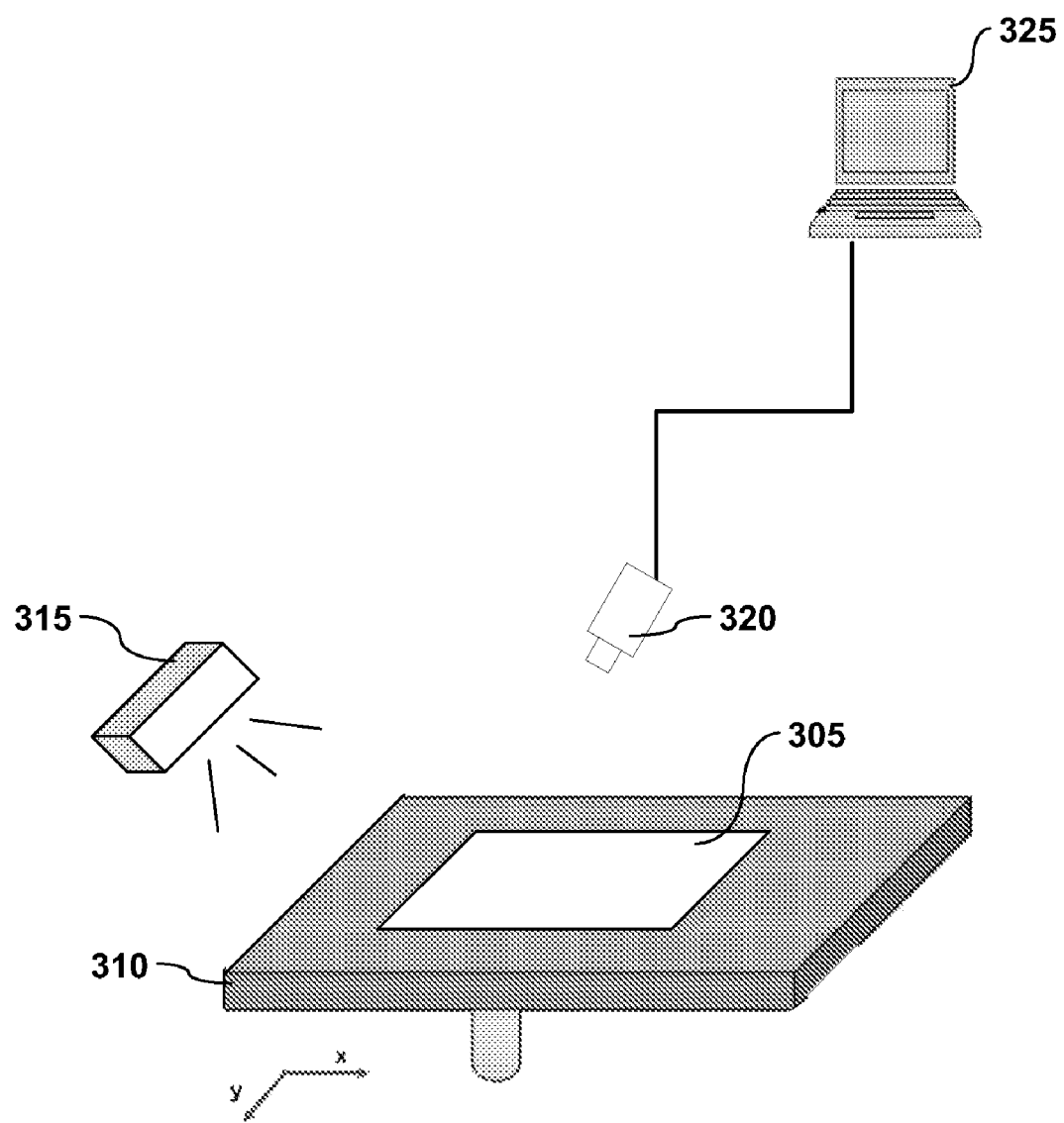
FIG. 3 illustrates an image capture system according to various embodiments of the invention.

FIG. 3 illustrates an exemplary image capture system according to various embodiments of the invention. The image capture system may include a camera 320 that is controlled and positioned by a control arm within a two-dimensional space above an input printed pattern 305 positioned on a two-dimensional surface 310. In certain embodiments, the position of the camera 320 is fixed by the control arm and the two-dimensional surface 310 is a movable surface (an "xy-table" in various embodiments). The location of the input printed pattern 305 is changed relative to the camera position by moving the two-dimensional surface 310 so that different sections of the input image may be photographed. In embodiments, the two-dimensional surface 310 is illuminated by a lighting source 315. In embodiments, sections of a printed pattern 305 may be captured and stored if the entire image cannot be captured in a single scan. As will be described in more detail below, sections may be captured at designated locations along a specified scan path across the image according to various embodiments of the invention.

In various embodiments of the invention, an image capture system also comprises a computer 325 that is connected to the camera. The computer 325 may provide certain processing functions used to optimize both the focus and exposure setting of the camera 320. In embodiments, storing and processing of images captured by the camera may be performed at the computer 325. A captured printed image may be reconstructed from a set of captured and stored ("registered") sections of the image.

The image capturer 255 receives an input printed pattern 205 and a reference bitmap 225 generated from the input printed pattern 205, and produces a captured snapshot of the input printed pattern 205. In various embodiments, image capturer 255 may capture a section of the input printed pattern 205, and a received exclusion map 250 based on the input printed pattern 205 may be used in part to select the section to be captured. Image capture in various embodiments may include initial calibration of the image capture system. This calibration is based at least in part on a comparison between characteristics of an aligned printed image or section of the printed pattern 305 on the two-dimensional surface 310 and characteristics of its corresponding reference bitmap 225.

In embodiments, the position of an image to be captured on the two-dimensional surface is computed based at least in part on configuration data derived from generation of a reference bitmap of the image 225 and from calibration of the image capture system. Examples of configuration data include reference bitmap configuration parameters, the mapping between the reference bitmap and the two-dimensional surface, the initial locations on the two-dimensional surface and the reference bitmap, two-dimensional surface motor step sizes in the x and y directions ("xStep" and "yStep", respectively), the slant angle (alignment validation parameter) computed during calibration, and the width and height of the reference bitmap section corresponding to the image snapshot. Those skilled in the art will recognize that a variety of configuration data exist and that the choice of data to be used in initialization is not critical to the invention.

In embodiments, image validator 260 receives a captured snapshot and validates the quality of the snapshot based in part on the snapshot's image characteristics that may include contrast and sharpness. In embodiments of an image capture system, image sharpness may be determined from a measurement of the amount of high frequency components in the snapshot, while image contrast may be computed from the average intensity difference around the edges of the snapshot. If the quality of the captured snapshot exceeds a quality threshold, the valid captured snapshot is retained.

In embodiments, image aligner 265 receives a valid captured image and then validates the alignment between the captured image and its corresponding reference bitmap. As described in more detail below, image aligner 265 then aligns the captured image with its corresponding reference bitmap and registers the aligned image 270.

B. Methods for Capturing Aligning, and Registering an Image

As was previously discussed, a snapshot of an image may be captured and used in embodiments of an inspection system that detects faults in printed images. If the entire printed image cannot be captured in a single scan, a captured image may be reconstructed from a set of captured and stored sections of the printed image. In embodiments, sections may be captured at designated locations along a specified scan path across the image.

Figure 4:
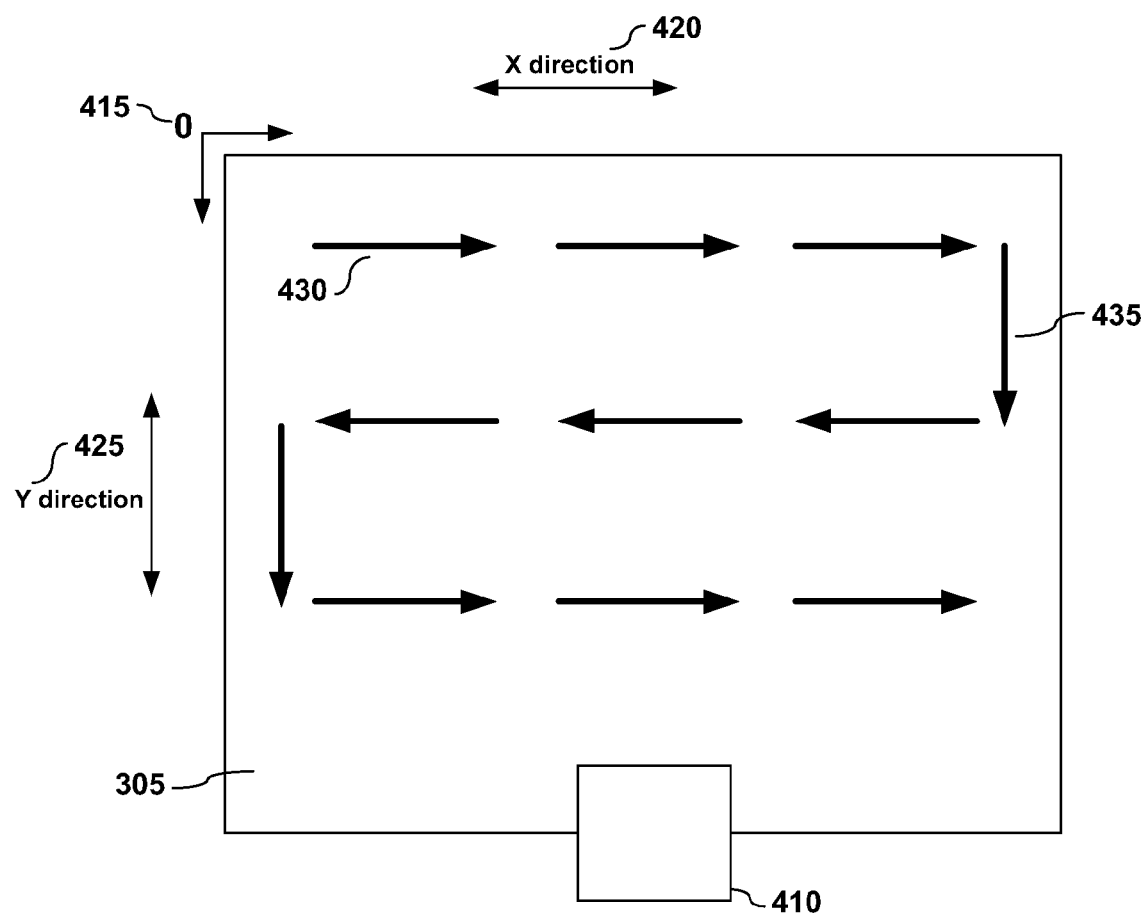
FIG. 4 illustrates an example of a scan path for stepwise scanning of sections of an image according to various embodiments of the invention.

FIG. 4 illustrates an exemplary scan path across a printed pattern 305 for capturing a set of image sections 410 using an inspection system as exemplified and illustrated in FIG. 3. In certain embodiments, the position of the camera 320 is fixed by the control arm and the location of the input printed pattern 305 is changed relative to the camera position by moving a movable two-dimensional surface 310 (e.g., an "xy-table" in various embodiments) on which the printed pattern 305 is placed so that different sections of the input printed pattern 305 may be photographed.

The scan path may be comprised of a sequence of motor steps (430 and 435) starting at an origin point 415 on the printed pattern 305. Each motor step represents one movement of the two-dimensional surface 310 relative to the fixed position of the camera 320, and a snapshot may be captured after each motor step. In various embodiments, capturing a sequence of sections of an input image using a computed scan path based on configuration parameters is "intelligent scanning."

Figure 5:
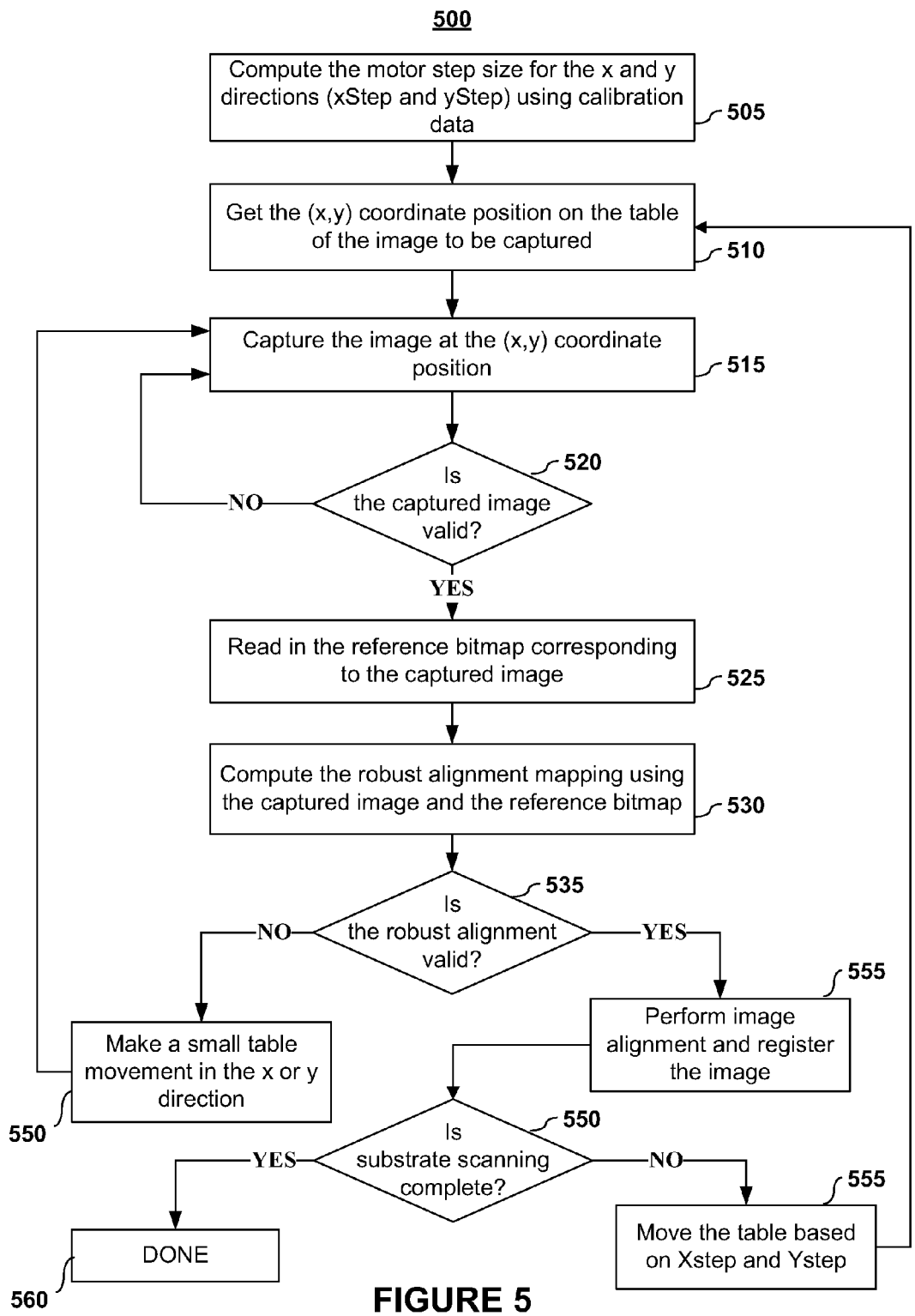
FIG. 5 depicts a method for capturing, aligning, and registering an image according to various embodiments of the invention.

FIG. 5 depicts a method 500, independent of structure, for capturing, aligning, and registering an image according to various embodiments of the invention. Method 500 may be implemented in embodiments of image generator 230 in system 200.

In embodiments, the motor step size in the x direction 420 (xStep 430) and the motor step size in the y direction 425 (yStep 435) may be computed 505 using parameters determined during the initial calibration of the system such as the reference bitmap size and the amount of overlap in the x and y directions that is needed between sections to be captured.

In embodiments, the position of an image to be captured on the two-dimensional surface is computed 510 based at least in part on configuration data derived from generation of a reference bitmap of the image 225 and from calibration of the image capture system. Examples of configuration data that may be used include reference bitmap configuration parameters, the mapping between the reference bitmap and the two-dimensional surface, the initial locations on the two-dimensional surface and the reference bitmap, xStep 430 and yStep 435, the slant angle (alignment validation parameter) computed during calibration, and the width and height of the reference bitmap section corresponding to the image snapshot. Those skilled in the art will recognize that a variety of configuration data exist and that the choice of data to be used in initialization is not critical to the invention.

After an image snapshot is captured 515, the quality of the snapshot based in part on the snapshot's image characteristics, which may include contrast and sharpness. In embodiments of an image capture system, image sharpness may be determined from a measurement of the amount of high frequency components in the snapshot, while image contrast may be computed from the average intensity difference around the edges of the snapshot. If the quality of the captured snapshot does not exceed a quality threshold 520, the snapshot is not retained and another snapshot is captured 515 at the same coordinate position using different camera calibrations. If the quality of the captured snapshot exceeds a quality threshold 520, the valid captured snapshot is retained and a reference bitmap 225 corresponding to the snapshot image is extracted from storage 525 so that a robust alignment mapping between the snapshot image and the reference bitmap may be computed 530. In embodiments, this robust alignment mapping may be expressed as an estimated affine matrix computed from matching features of the snapshot image and the reference bitmap.

In embodiments, methods hosted on the camera 320 or hosted on the computer 325 of an inspection system may be used to improve the quality of a captured snapshot in real time by compensating for measured characteristics that do not meet quality standards. For example, contrast may be improved by an auto-exposure method while sharpness may be improved by an auto-focus method.

The robust alignment mapping is validated 535 by an analysis of the image and the reference bitmap. In embodiments, the robust alignment mapping is valid if the computed angle of rotation between the image and the reference bitmap is close to zero (for example, within ±1 degree). In various embodiments, the angle of rotation may be determined from an affine matrix that is computed from matching features of the snapshot image and the reference bitmap. The components of the affine matrix may be simplified and divided into two independent spaces, scaling and rotation. The angle of rotation may be calculated using the rotation space.

If the robust alignment mapping is valid 535, the image and the reference bitmap are aligned and the image is registered (i.e., stored and recorded) 555. The set of images to be captured is completed 560 if the designated scan path over the substrate has been completed 550. If the designated scan path over the substrate has not been completed 550, the two-dimensional surface is moved 555 along the scan path based on the values of the motor steps Xstep and Ystep.

If the robust alignment mapping is not valid 535, it may be due to the captured image having a periodic pattern. In embodiments, aperiodicity of the pattern may be introduced if the position of the captured image on the substrate is adjusted slightly by moving 550 the two-dimensional surface up, down, to the right, or to the left from the current position of the captured image and then repeating steps 515 through 535. In embodiments, for example, the two-dimensional surface may be moved within a range of 4-5 mm in the x and y direction, which may be 10% of a motor movement of the two-dimensional surface. If a valid robust alignment mapping is accomplished 535, the position of the original captured image on the scan path is restored.

1. Computing a Robust Alignment Mapping

Figure 6:
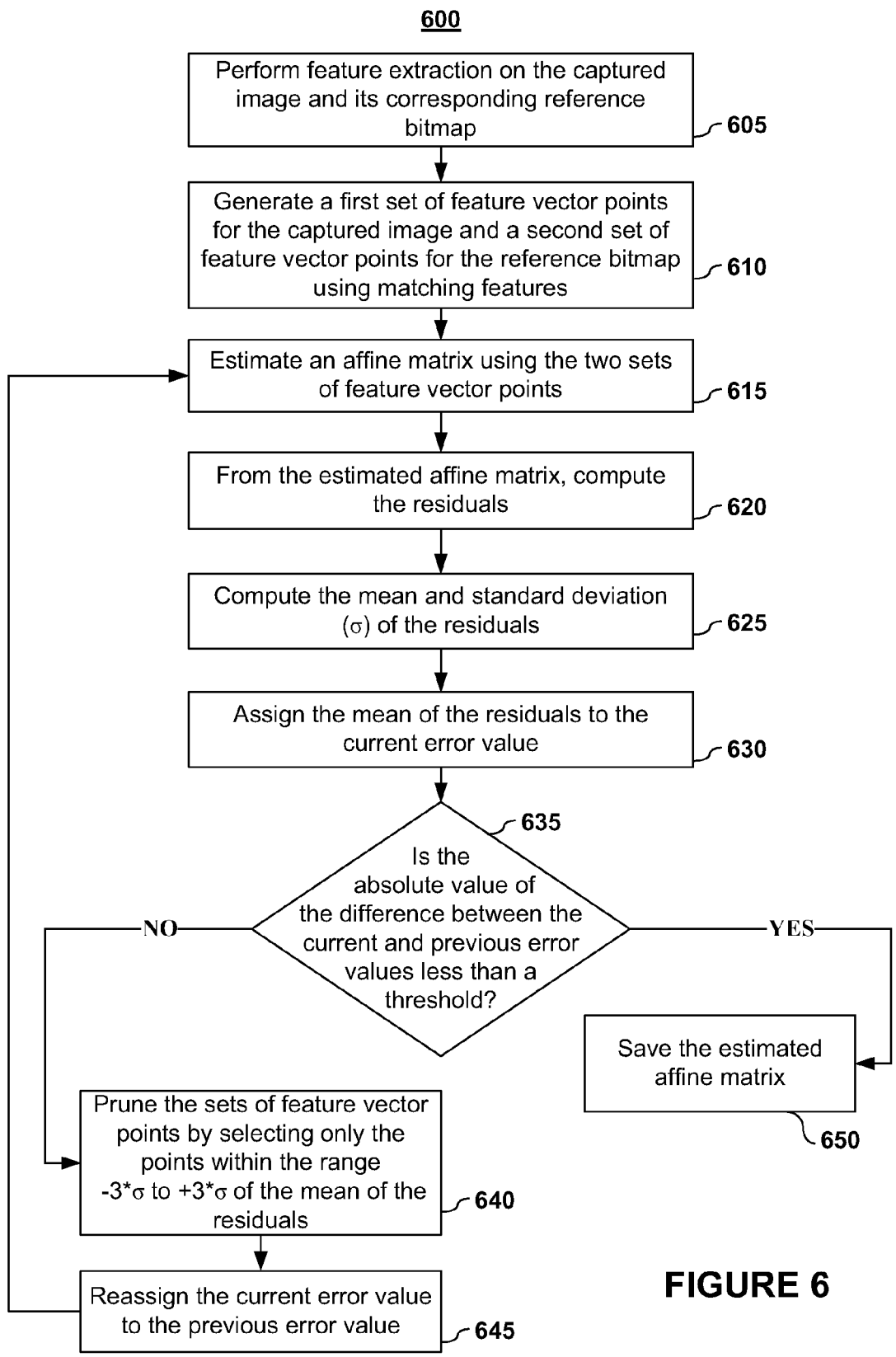
FIG. 6 depicts a method for computing alignment mapping of a captured image and its corresponding reference bitmap according to various embodiments of the invention.

FIG. 6 depicts a method 600, independent of structure, for computing a robust alignment mapping according to various embodiments of the invention. Method 600 may be implemented as step 530 in embodiments of method 500, and in embodiments of image aligner 265.

In embodiments, features are extracted 605 from a captured snapshot of the image and its corresponding reference bitmap using a feature extractor such as a SIFT feature extractor. Those skilled in the art will recognize that a variety of feature extraction methods exist and that the choice of a feature extractor is not critical to the invention. Matching features from the image and reference bitmap are identified. Examples of features that may be identified include lines, circles, and, for PCB images, junctions and corners on the circuit. A first feature vector comprising a set of the matching features (a set of feature points) is extracted from the image, and a second feature vector comprising the same set of matching features is extracted from the reference bitmap 610. In various embodiments, illumination changes in various regions on the designated scan path will not affect the consistency of the feature extraction method.

In embodiments, a least squares method may be used to estimate 615 an affine matrix representing the mapping of points of the first feature vector to the corresponding points of the second feature vector. Those skilled in the art will recognize that a variety of methods exist for estimating an affine matrix, and that the choice of a method for estimating an affine matrix is not critical to the invention. The residuals are computed 620 from the estimated affine matrix. The mean and standard deviation ($\sigma$) of the residuals are computed 625, and the mean of the residuals is assigned 630 to be the current error value. The absolute value of the difference between the current error value and the previous error value computed from a previous estimated affine matrix is compared 635 to a threshold value (In embodiments, this value may be 1 pixel, for example). If the absolute value of the difference is less than the threshold value, the estimated affine matrix is saved 650.

If the absolute value of the difference is greater than the threshold value, the sets of feature points are pruned 640 to contain only those points with mappings within $-3*\sigma$ to $+3*\sigma$ of the mean of the residuals. The current error value is re-assigned to be the previous error value 645 and steps 615 through 635 are repeated.

C. Computing System Implementations

It shall be noted that the present invention may be implemented in any instruction-execution/computing device or system capable of processing the image data, including without limitation, a general-purpose computer and a specific computer, such as one intended for graphics processing. The present invention may also be implemented into other computing devices and systems, including without limitation, a digital camera, a printer, a scanner, a multiple function printer/scanner, a facsimile machine, a multimedia device, and any other device that processes, captures, transmits, or stores an image. Furthermore, within any of the devices, aspects of the present invention may be implemented in a wide variety of ways including software, hardware, firmware, or combinations thereof. For example, the functions to practice various aspects of the present invention may be performed by components that are implemented in a wide variety of ways including discrete logic components, one or more application specific integrated circuits (ASICs), and/or program-controlled processors. It shall be noted that the manner in which these items are implemented is not critical to the present invention.

Figure 7:
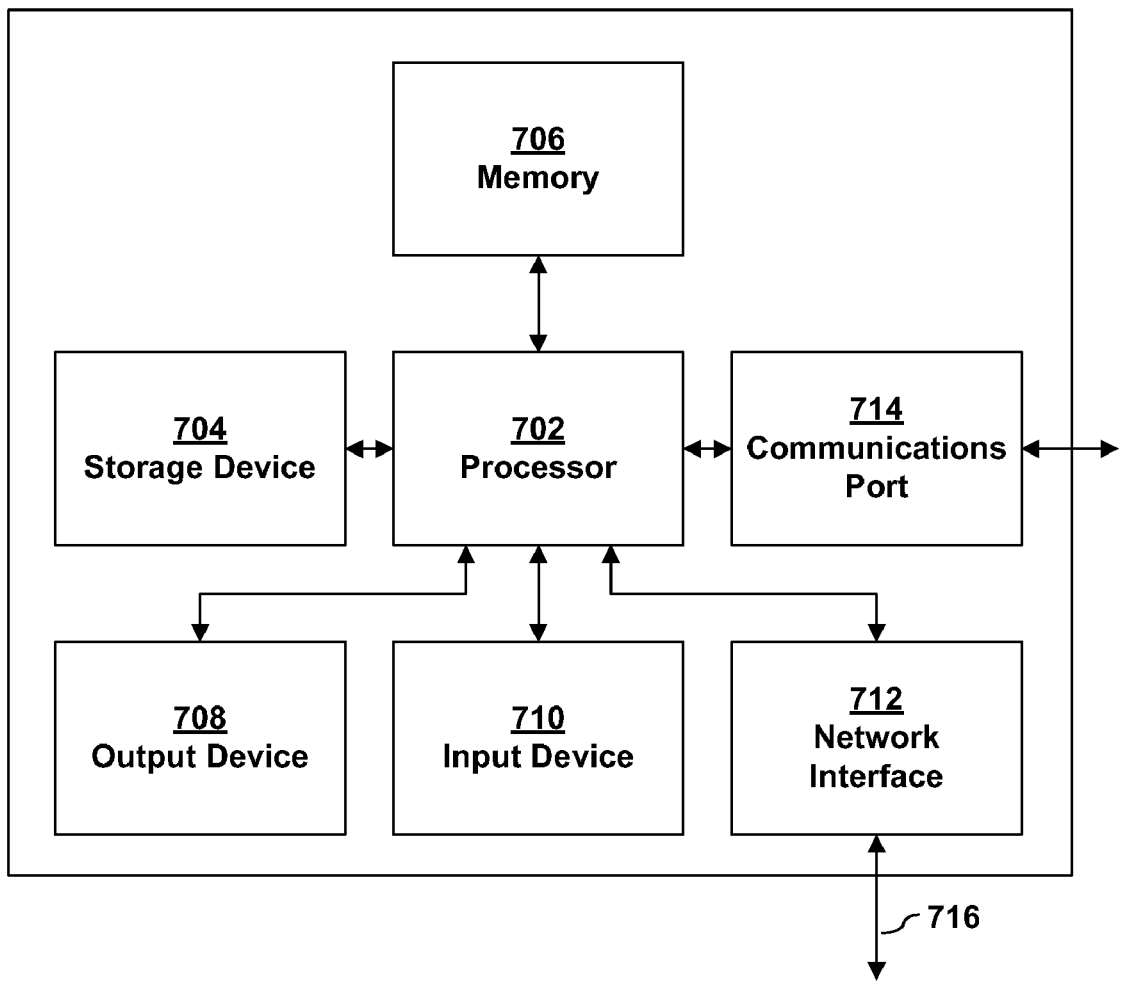
FIG. 7 depicts a block diagram of a computing system.

FIG. 7 depicts a functional block diagram of an embodiment of an instruction-execution/computing device 700 that may implement or embody embodiments of the present invention. As illustrated in FIG. 7, a processor 702 executes software instructions and interacts with other system components. In an embodiment, processor 702 may be a general purpose processor such as (by way of example and not limitation) an AMD processor, an INTEL processor, a SUN MICROSYSTEMS processor, or a POWERPC compatible-CPU, or the processor may be an application specific processor or processors. A storage device 704, coupled to processor 702, provides long-term storage of data and software programs. Storage device 704 may be a hard disk drive and/or another device capable of storing data, such as a computer-readable media (e.g., diskettes, tapes, compact disk, DVD, and the like) drive or a solid-state memory device. Storage device 704 may hold programs, instructions, and/or data for use with processor 702. In an embodiment, programs or instructions stored on or loaded from storage device 704 may be loaded into memory 706 and executed by processor 702. In an embodiment, storage device 704 holds programs or instructions for implementing an operating system on processor 702. In one embodiment, possible operating systems include, but are not limited to, UNIX, AIX, LINUX, Microsoft Windows, and the Apple MAC OS. In embodiments, the operating system executes on, and controls the operation of, the computing system 700.

An addressable memory 706, coupled to processor 702, may be used to store data and software instructions to be executed by processor 702. Memory 706 may be, for example, firmware, read only memory (ROM), flash memory, non-volatile random access memory (NVRAM), random access memory (RAM), or any combination thereof. In one embodiment, memory 706 stores a number of software objects, otherwise known as services, utilities, components, or modules. One skilled in the art will also recognize that storage 704 and memory 706 may be the same items and function in both capacities. In an embodiment, one or more of the components of FIGS. 2A and 2B may be modules stored in memory 704, 706 and executed by processor 702.

In an embodiment, computing system 700 provides the ability to communicate with other devices, other networks, or both. Computing system 700 may include one or more network interfaces or adapters 712, 714 to communicatively couple computing system 700 to other networks and devices. For example, computing system 700 may include a network interface 712, a communications port 714, or both, each of which are communicatively coupled to processor 702, and which may be used to couple computing system 700 to other computer systems, networks, and devices.

In an embodiment, computing system 700 may include one or more output devices 708, coupled to processor 702, to facilitate displaying graphics and text. Output devices 708 may include, but are not limited to, a display, LCD screen, CRT monitor, printer, touch screen, or other device for displaying information. Computing system 700 may also include a graphics adapter (not shown) to assist in displaying information or images on output device 708.

One or more input devices 710, coupled to processor 702, may be used to facilitate user input. Input device 710 may include, but are not limited to, a pointing device, such as a mouse, trackball, or touchpad, and may also include a keyboard or keypad to input data or instructions into computing system 700.

In an embodiment, computing system 700 may receive input, whether through communications port 714, network interface 712, stored data in memory 704/706, or through an input device 710, from a scanner, copier, facsimile machine, or other computing device.

One skilled in the art will recognize no computing system is critical to the practice of the present invention. One skilled in the art will also recognize that a number of the elements described above may be physically and/or functionally separated into sub-modules or combined together.

It shall be noted that embodiments of the present invention may further relate to computer products with a computer-readable medium that have computer code thereon for performing various computer-implemented operations. The media and computer code may be those specially designed and constructed for the purposes of the present invention, or they may be of the kind known or available to those having skill in the relevant arts. Examples of computer-readable media include, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices. Examples of computer code include machine code, such as produced by a compiler, and files containing higher level code that are executed by a computer using an interpreter.

While the invention is susceptible to various modifications and alternative forms, specific examples thereof have been shown in the drawings and are herein described in detail. It should be understood, however, that the invention is not to be limited to the particular forms disclosed, but to the contrary, the invention is to cover all modifications, equivalents, and alternatives falling within the scope of the appended claims.

What is claimed is:

1. A method for constructing a composite image of a subject, the method comprising:
    calibrating an imaging device to said subject, said calibrating including comparing characteristics of a reference image of said subject with corresponding characteristics of said subject as imaged by said imagining device, mapping the position of said imaging device to a known position on said subject and computing a slant angle, wherein said imaging device images a portion of said subject at a time;
    changing in discrete position steps the imaging position of said imaging device relative to said subject to span said subject in a step-by-step fashion, and implementing the following sub-steps at each discrete position step:
    (a) capturing a current snapshot of the portion of said subject currently imaged by said imaging device at the current discrete position step;
    (b) determining a first set of feature points within the current snapshot and a second set of feature points within its corresponding portion in said reference image;
    (c) identifying corresponding feature points within said first and second sets of feature points;
    (d) determining the affine angle of the identified corresponding feature points; and
    (e) IF the magnitude of said affine angle is greater than a predefined maximum affine angle, THEN making a position adjustment of said imaging device relative to said subject that is smaller than said discrete position steps, capturing a current snapshot of the portion of said subject corresponding to the position adjustment, and returning to sub-step (b); and
    (f) storing and registering the snapshot of said subject corresponding to the current discrete position step.

2. The method of claim 1, wherein in sub-step (e), IF said affine angle is greater than the predefined maximum affine angle, THEN the portion of said subject corresponding to current discrete position step is deemed to be periodic and the position adjustment provides an aperiodic view of said subject.

3. The method of claim 1, wherein sub-step (e) further includes IF said affine angle is not greater than the predefined maximum affine angle, THEN the portion of said subject corresponding to current snapshot is deemed to be aperiodic.

4. The method of claim 1, wherein sub-step (a) further includes:
    computing an image contrast measure of the current snapshot; and
    IF the computed an image contrast measure does not exceed a predefined threshold, THEN using an auto-exposure method to modify the exposure settings of the imaging device and recapturing said current snapshot at the current discrete position step using the modified exposure settings.

5. The method of claim 4, wherein said image contrast measure is computed from the average intensity difference around the edges of the current snapshot.

6. The method of claim 1, wherein sub-step (a) further includes:
    computing a sharpness measure of the current snapshot; and
    IF the computed sharpness measure does not exceed a predefined threshold, THEN using an auto-focus method to modify the focus settings of the imaging device and recapturing said current snapshot at the current discrete position step using the modified focus settings.

7. The method of claim 6, wherein said sharpness measure is computed from a measurement of the amount of high frequency components in the snapshot.

8. The method of claim 7, wherein in sub-step (e), said predefined maximum affine angle is 1 degree.

9. The method of claim 1, wherein sub-step (a) further includes:
    determining an image quality measure of the current snapshot based at least on a computed image contrast measure and a computed sharpness measure of the current snapshot; and
    IF the determined image quality measure does not exceed a predefined quality threshold, THEN modifying the contrast and sharpness settings of the imaging device, discarding the current snapshot and capturing a replacement current snapshot at the current discrete position.

10. The method of claim 1, wherein said feature points are SIFT feature points obtained with a SIFT application.

11. The method of claim 10, wherein said affine angle is determined from an affine matrix computed from the corresponding SIFT features points.

12. The method of claim 11, wherein determining of said affine matrix includes the following sub-steps:
    (i) defining an estimated affine matrix from the SIFT feature points under consideration;
    (ii) computing residuals from the estimated affine matrix;
    (iii) computing the mean and standard deviation of the residuals;
    (iv) assigning said mean to a current error value;
    (v) IF the magnitude of the difference between the current error value and a previous error value is less than a threshold,
        THEN saving the estimated affine matrix,
        ELSE removing from consideration feature points outside a range defined by the magnitude of three standard deviations, assigning the current error value to the previous error value, and returning to sub-step (i).

13. The method of said 1, wherein said discrete position steps are limited to horizontal and vertical transitional steps within an x-y Cartesian plane.

14. The method of claim 13 wherein said discrete position steps have a fixed size and not greater than the imaging view of said imaging device.

15. The method of claim 14, wherein in sub-step (e), said position adjustment is not greater than 10 percent of the fixed size of one said discrete position steps.

16. The method of claim 1, wherein:
said imaging device faces the front of said subject; and
said method further includes, prior to the step of calibrating the imaging device to said subject, providing a lighting source facing the front of said subject and excluding any lighting sources from behind said subject.

17. The method of claim 16, wherein said subject is a circuit substrate printed using an inkjet printer.

18. The method of claim 17, wherein said circuit substrate is dot-pattern image created by a printed circuit board.

19. The method of claim 18, wherein said reference image is a simulation of said printed circuit board as printed by said inkjet printer, and includes user-provided print characteristics including a printer pitch parameter and a printer droplet size parameter.

20. The method of claim 1, further including constructing a distortion map highlighting specific types of aberrations identified by comparing the reference image with the stored and registered portions of the composite image.

* * * * *